US007672150B2

United States Patent
Sellar

(10) Patent No.: US 7,672,150 B2
(45) Date of Patent: Mar. 2, 2010

(54) APPARATUS, EMBEDDED MEMORY, ADDRESS DECODER, METHOD OF READING OUT DATA AND METHOD OF CONFIGURING A MEMORY

(75) Inventor: David A. Sellar, Munich (DE)

(73) Assignee: Infineon Technologies AG, Neubiberg (DE)

( * ) Notice: Subject to any disclaimer, the term of this patent is extended or adjusted under 35 U.S.C. 154(b) by 13 days.

(21) Appl. No.: 11/862,212

(22) Filed: Sep. 27, 2007

(65) Prior Publication Data

US 2009/0086526 A1    Apr. 2, 2009

(51) Int. Cl.
*G11C 8/00*    (2006.01)

(52) U.S. Cl. .................. 365/96; 365/94; 365/225.7; 365/230.06

(58) Field of Classification Search .............. 365/96
See application file for complete search history.

(56) References Cited

U.S. PATENT DOCUMENTS

| | | | | |
|---|---|---|---|---|
| 5,337,278 A | * | 8/1994 | Cho | ............................ 365/200 |
| 5,388,076 A | * | 2/1995 | Ihara | ........................... 365/200 |
| 5,757,690 A | | 5/1998 | McMahon | |
| 5,764,575 A | * | 6/1998 | Kawai et al. | ................. 365/200 |
| 6,041,007 A | * | 3/2000 | Roeckner | ................. 365/225.7 |
| 6,262,926 B1 | * | 7/2001 | Nakai | .......................... 365/200 |
| 6,396,767 B1 | * | 5/2002 | Tzeng et al. | ............ 365/230.06 |
| 6,785,170 B2 | | 8/2004 | Paul et al. | |

* cited by examiner

*Primary Examiner*—Tan T. Nguyen
(74) *Attorney, Agent, or Firm*—SpryIP, LLC

(57) ABSTRACT

Embodiments of the invention relate generally to an apparatus, to an embedded memory, to an address decoder, to a method of reading out data and to a method of configuring a memory. In an embodiment of the invention an apparatus is provided. The apparatus may include a plurality of read-only memory (ROM) cells and an address decoder to access a ROM cell of the plurality of ROM cells, the address decoder further being fuse-programmable to divert an access to the ROM cell to a different memory cell.

21 Claims, 3 Drawing Sheets

301

Fuse-programming an address decoder configured to access a read-only memory (ROM) cell to divert an accessing of the ROM cell to a different memory cell

FIG. 3

APPARATUS, EMBEDDED MEMORY, ADDRESS DECODER, METHOD OF READING OUT DATA AND METHOD OF CONFIGURING A MEMORY

TECHNICAL FIELD

Embodiments of the invention relate generally to an apparatus, to an embedded memory, to an address decoder, to a method of reading out data and to a method of configuring a memory.

BRIEF DESCRIPTION OF THE SEVERAL VIEWS OF THE DRAWINGS

FIG. 3 shows a method of configuring a memory in accordance with an embodiment of the invention.

DETAILED DESCRIPTION OF THE INVENTION

Figure 1:
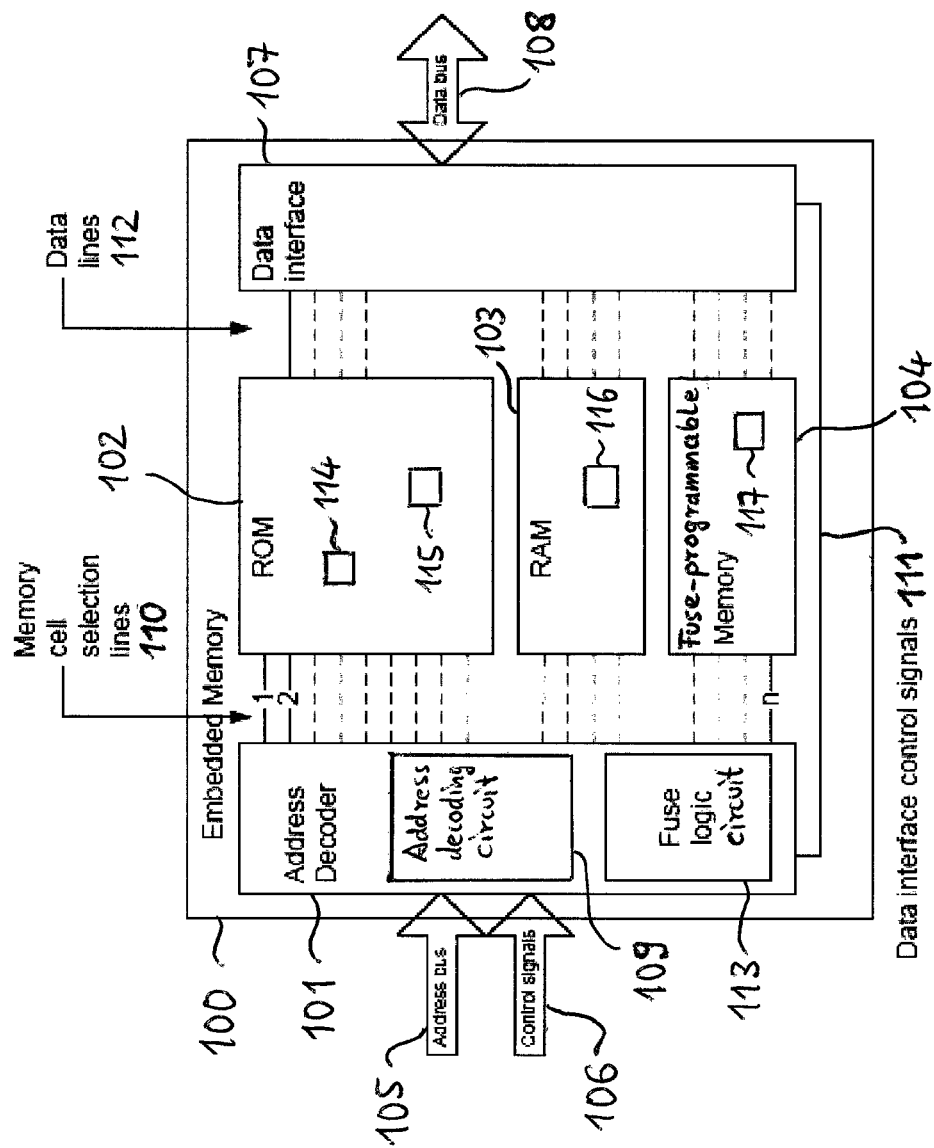
FIG. 1 shows a block diagram of an apparatus, an embedded memory and an address decoder in accordance with embodiments of the invention.

The following detailed description explains exemplary embodiments of the present invention. The description is not to be taken in a limiting sense, but is made only for the purpose of illustrating the general principles of the invention. The scope of the invention, however, is only defined by the claims and is not intended to be limited by the exemplary embodiments described below.

When a memory or an embedded memory is required for an integrated circuit, it is generally desirable to use a memory or an embedded memory having low cost and high flexibility.

In an embodiment of the invention, fusing methods and a fuse logic implemented to control accesses to the memory cells of an embedded read-only memory (ROM) realize to allow changes and patches to code and data stored in the ROM at low cost and without having to wait for a new production cycle of the ROM with updated content.

Integrated circuits often require on-chip or embedded memory, for example to store program code and data constants to be used by a processor. Random-access memory (RAM), flash memory or read-only memory (ROM) may be used for an on-chip or embedded memory.

Read-only memory, ROM, is a very attractive option because of its high packing density and low cost. However, ROM code is fixed during the production process and if changes are required due to errors in the program or due to changed requirements, the production has to be stopped and new masks have to be generated for the new code. This is expensive and interrupts the production output until the new devices have been produced.

Flash memory or RAM may be used instead of ROM. The code has to be loaded into the flash memory or RAM. This adds complexity and increases cost. A production process which includes flash memory is more expensive than a ROM process. RAM requires a much larger chip area than an equivalent ROM. This makes it more expensive than ROM.

A large ROM may be used and in addition a small RAM. The program code in the RAM controls access to the ROM code. If part of the ROM code is faulty, the RAM code doesn't use it but replaces it with corrected code. However, the frequent jumps between RAM and ROM lead to a reduction in performance. The places where the program flow jumps from ROM to RAM have to be defined in advance. They may not be suitable for the required changes.

In accordance with an embodiment of the invention, an apparatus is provided comprising a plurality of read-only memory (ROM) cells and an address decoder to access a ROM cell of the plurality of ROM cells, the address decoder further being fuse-programmable to divert an access to the ROM cell to a different memory cell.

In accordance with an embodiment of the invention, an embedded memory is provided comprising a plurality of read-only memory (ROM) cells and an address decoder to access a ROM cell of the plurality of ROM cells, the address decoder further being fuse-programmable to divert an access to the ROM cell to a different memory cell.

In accordance with another embodiment of the invention, an address decoder is provided comprising an address decoding circuit to access each of a plurality of read-only memory (ROM) cells and a fuse logic circuit, the fuse logic circuit being associated with at least one programmable fuse and the fuse logic circuit further to divert an access directed to a ROM cell of the plurality of ROM cells to a different memory cell if the at least one programmable fuse has been programmed.

In accordance with yet another embodiment of the invention, a method of reading out data is provided comprising receiving an address specifying a read-only memory (ROM) cell, diverting an accessing of the ROM cell by an address decoder to a different memory cell, the address decoder having been configured to access the ROM cell and being fuse-programmed to divert the accessing of the ROM cell to the different memory cell, and reading out data from the different memory cell.

In accordance with yet another embodiment of the invention, a method of configuring a memory is provided comprising fuse-programming an address decoder configured to access a read-only memory (ROM) cell to divert an accessing of the ROM cell to a different memory cell.

This has the effect of a low risk that necessary changes and patches interrupt the production output and require costly production changes. This has the further effect that large and complex program code and data can be implemented in an embedded ROM at low cost and with high flexibility.

Referring to FIG. 1, a block diagram of an apparatus, an embedded memory and an address decoder in accordance with embodiments of the invention is explained further.

An embedded memory 100 includes an address decoder 101 and a ROM 102. The ROM 102 contains a plurality of ROM cells. The address decoder 101 is configured to access each of the cells of the ROM 102. One possible implementation uses an address decoder for the ROM which can be fuse-programmed to divert some accesses to the ROM to an alternative memory address in ROM. Alternatively the accesses are diverted to an address in a small RAM memory 103, or to a small fuse-programmable memory 104 (array of programmable fuses which function as a replacement for the ROM code which is no longer valid).

Access to memory locations in the embedded memory 100 is controlled by an address bus 105 and control signals 106. A data interface 107 and one or more data busses 108 are used to transfer data into the memory and out of the memory. The address decoder 101 has an address decoding circuit 109 configured to map the data addresses to physical memory locations in the memory. To do this for a read operation it activates memory cell selection lines 110 (shown are such lines numbered 1, 2, ..., n) and data interface control signals 111 which in turn activate and select a memory location and connect the data at that location via data lines 112 to the data interface 107 and the data bus 108.

Usually the mapping function in the address decoder 101 is fixed at the design stage of the embedded memory 100. In the shown embodiment of the invention the address decoder includes a fuse logic or fuse logic circuit 113 which allows the function of the address decoder to be modified by fuses. The fuses themselves may be inside or outside the memory. The fuses may be inside or outside the fuse logic. The function of the fuse logic circuit 113 is to allow memory accesses to be diverted from some of the memory locations determined by the design to new memory locations defined by fuse values. Diverting to these new locations can be to a different location in the same part of the memory, for example the ROM 102, or to the RAM 103, or to a fuseable memory, the fuse-programmable memory 104 whose cells are defined by fuses. If the ROM code is found to be faulty or if a change is required the fuse logic circuit 113 can be used to divert an access of the unwanted code to new code previously loaded into RAM. Alternatively an access of the unwanted code can be diverted to new code in the fuseable area of the memory.

The effect of fuse-programming the address decoder 101 is now described referring to one ROM memory cell 114 by way of example. As long as all fuses are in their initial state the address decoding circuit 109 maps the data addresses to original physical memory locations in the ROM 102. In this original state a certain data address may require an access of the ROM memory cell 114. If a respective fuse has been programmed, in other words if the fuse has been activated or "blown", the address decoding circuit 109 and the fuse logic circuit 113 cooperate to map the data address which originally required an access of the ROM memory cell 114 to a new memory cell. The new memory cell may be another ROM memory cell 115 or a RAM memory cell 116 or a fuse-programmable memory cell 117.

The fusing methods and fuse logic used here are similar to the fuse technology which is used today to increase the production yield of RAM cells by detecting and replacing faulty RAM cells in a RAM memory. In the case of RAM, a post production test is performed and any faulty memory cells are found. Then fuse logic in the RAM address decoder is modified to redirect accesses to faulty cells to functional cells reserved for this purpose.

In the case of the embedded memory 100 and address decoder 101 shown in FIG. 1 the fuses cause accesses to an area of the ROM 102 which is no longer valid (because some program code using this area is to be modified) to be diverted to a different area in the ROM which contain further jumps to replacement code in the RAM 103. As an alternative, the fuses cause the ROM accesses to be directly diverted to the RAM 103. Alternatively, the fuses cause accesses to be diverted to the fuse-programmable memory 104 which is a fuseable memory containing replacement instructions. These solutions have in common the effect of reduced cost and higher flexibility.

The fusing may be performed by the manufacturer of an integrated circuit which includes the embedded memory. If required the fusing can also be performed by a device manufacturer who incorporates the integrated circuit with the embedded memory into a device, for example a wireless device, for example a mobile phone, as part of his production process. The fusing may also be performed in the course of a service or repair action, for example when a firmware update is needed for a mobile phone which is already in use by an end user.

Figure 2:
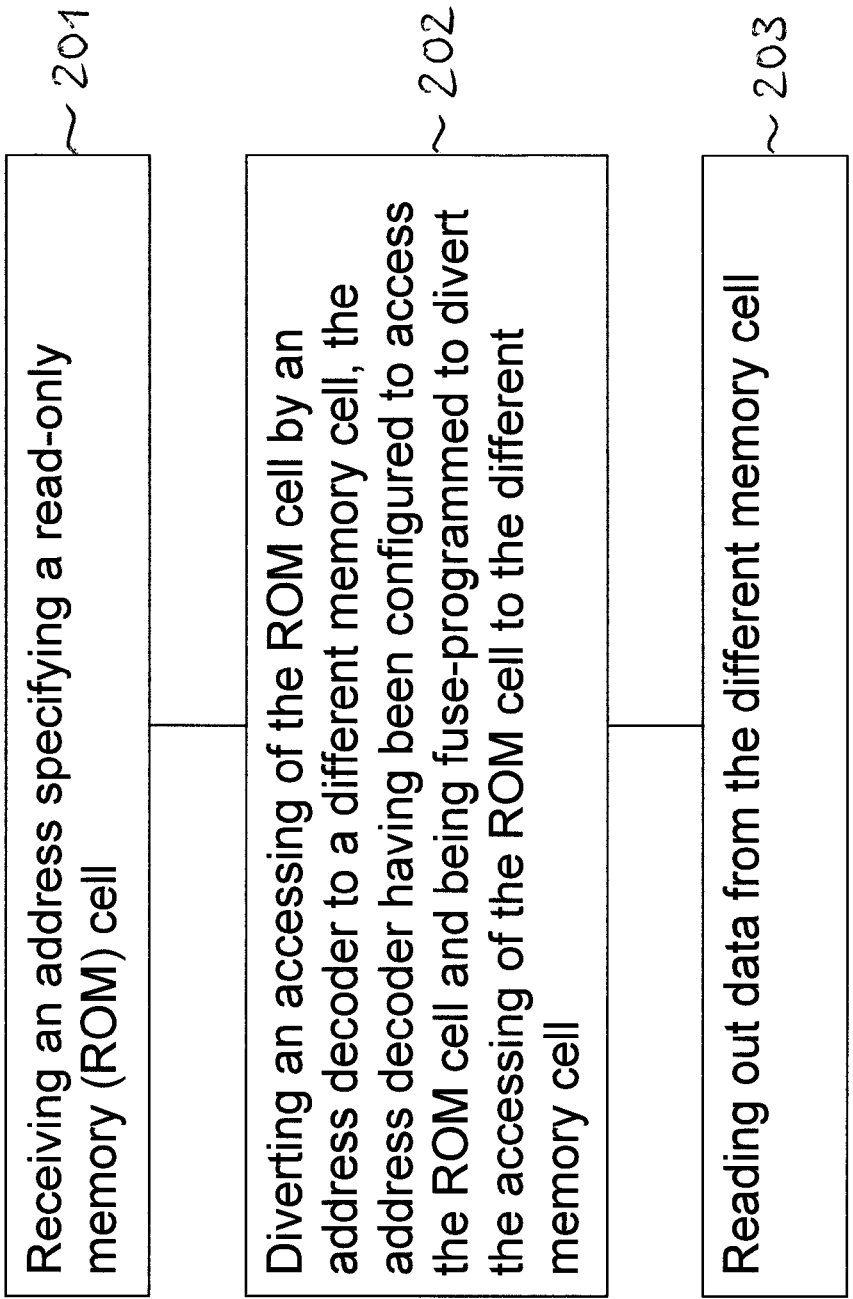
FIG. 2 shows a method of reading out data in accordance with an embodiment of the invention.

FIG. 2 shows a method of reading out data from a memory in accordance with an embodiment of the invention.

In 201, an address specifying a read-only memory (ROM) cell is received.

In 202, an accessing of the ROM cell by an address decoder is diverted to a different memory cell, the address decoder having been configured to access the ROM cell and being fuse-programmed to divert the accessing of the ROM cell to the different memory cell.

In 203, data are read out from the different memory cell.

FIG. 3 shows a method of configuring a memory in accordance with an embodiment of the invention.

In 301, an address decoder configured to access a read-only memory (ROM) cell is fuse-programmed to divert an accessing of the ROM cell to a different memory cell.

While some embodiments of the invention have been shown in the figures and described in more detail by way of example, various other embodiments have been contemplated by the inventor.

In an embodiment of the invention, the different memory cell is a random-access memory (RAM) cell.

In an embodiment of the invention, the different memory cell is a memory cell of a fuse-programmable memory.

In an embodiment of the invention, the different memory cell is a ROM cell.

In an embodiment of the invention, the different memory cell is included in the apparatus.

In an embodiment of the invention, the different memory cell is defined by an earlier reconfiguration of the address decoder by programmable fuses.

In an embodiment of the invention, the address decoder has been previously fuse-programmed to divert an accessing of the ROM cell to a different memory cell.

In an embodiment of the invention, the different memory cell contains an information specifying a further different memory cell.

In an embodiment of the invention, the reading out data includes reading out an information specifying a further different memory cell.

In an embodiment of the invention, the reading out data includes reading out a processor executable instruction.

In an embodiment of the invention, the reading out data includes fuse-programming the address decoder configured to access the ROM cell to divert the accessing of the ROM cell to the different memory cell.

In an embodiment of the invention, the fuse-programming includes electrically fuse-programming.

In an embodiment of the invention, a wireless device includes an embedded memory according to an embodiment of the invention.

The invention claimed is:

1. An apparatus, comprising:
a plurality of read-only memory (ROM) cells; and
an address decoder to access a ROM cell of the plurality of ROM cells, the address decoder further being fuse-programmable to divert an access to the ROM cell to a different memory cell, the different memory cell containing an information specifying a further different memory cell.

2. The apparatus as recited in claim 1, wherein the different memory cell is a random-access memory (RAM) cell.

3. The apparatus as recited in claim 1, wherein the different memory cell is a memory cell of a fuse-programmable memory.

4. The apparatus as recited in claim 1, wherein the different memory cell is a ROM cell.

5. The apparatus as recited in claim 1, wherein the different memory cell is included in the apparatus.

6. Embedded memory, comprising:
a plurality of read-only memory (ROM) cells; and
an address decoder to access a ROM cell of the plurality of ROM cells, the address decoder further being fuse-programmable to divert an access to the ROM cell to a different memory cell, the address decoder to divert the access to the ROM cell to the different memory based on code stored in the ROM cell and other code stored in the different memory cell.

7. Address decoder, comprising:
an address decoding circuit to access each of a plurality of read-only memory (ROM) cells; and
a fuse logic circuit, the fuse logic circuit being associated with at least one programmable fuse, the fuse logic circuit further to divert an access directed to a ROM cell of the plurality of ROM cells to a different memory cell if the at least one programmable fuse has been programmed, the different memory cell contain an information specifying a further different memory cell.

8. The address decoder as recited in claim 7, wherein the different memory cell is a random-access memory (RAM) cell.

9. The address decoder as recited in claim 7, wherein the different memory cell is a memory cell of a fuse-programmable memory.

10. The address decoder as recited in claim 7, wherein the different memory cell is a ROM cell.

11. The address decoder as recited in claim 10, wherein the different memory cell is one of the plurality of ROM cells.

12. Method of reading out data, comprising:
receiving an address specifying a read-only memory (ROM) cell;
diverting an accessing of the ROM cell by an address decoder to a different memory cell, the address decoder having been configured to access the ROM cell and being fuse-programmed to divert the accessing of the ROM cell to the different memory cell, the diverting based at least one code stored in the ROM cell and another code stored in the different memory cell; and
reading out data from the different memory cell.

13. The method of reading out data as recited in claim 12, further comprising fuse-programming the address decoder configured to access the ROM cell to divert the accessing of the ROM cell to the different memory cell.

14. The method of reading out data as recited in claim 13, wherein the fuse-programming includes electrically fuse-programming.

15. The method of reading out data as recited in claim 12, wherein the different memory cell is a random-access memory (RAM) cell.

16. The method of reading out data as recited in claim 12, wherein the different memory cell is a memory cell of a fuse-programmable memory.

17. The method of reading out data as recited in claim 12, wherein the different memory cell is a ROM cell.

18. The method of reading out data as recited in claim 12, wherein the reading out data includes reading out an information specifying a further different memory cell.

19. The method of reading out data as recited in claim 12, wherein the reading out data includes reading out a processor executable instruction.

20. Method of configuring a memory, comprising:
fuse-programming an address decoder configured to access a read-only memory (ROM) cell to divert an accessing of the ROM cell to a different memory cell, the different memory cell containing an information specifying a further different memory cell.

21. The method of configuring a memory as recited in claim 20, wherein the fuse-programming includes electrically fuse-programming.

* * * * *